(12) United States Patent
Kim et al.

(10) Patent No.: US 11,696,487 B2
(45) Date of Patent: Jul. 4, 2023

(54) MASK ASSEMBLY, APPARATUS FOR MANUFACTURING DISPLAY DEVICE, AND METHOD OF MANUFACTURING DISPLAY DEVICE

(71) Applicant: SAMSUNG DISPLAY CO., LTD., Yongin-si (KR)

(72) Inventors: Jeunghoon Kim, Yongin-si (KR); Seungmin Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 177 days.

(21) Appl. No.: 16/936,773

(22) Filed: Jul. 23, 2020

(65) Prior Publication Data

US 2021/0135112 A1 May 6, 2021

(30) Foreign Application Priority Data

Nov. 5, 2019 (KR) ........................ 10-2019-0140322

(51) Int. Cl.
*C23C 14/24* (2006.01)
*H10K 71/16* (2023.01)
*C23C 14/04* (2006.01)
*C23C 14/12* (2006.01)
*H10K 59/12* (2023.01)
*H10K 71/00* (2023.01)

(52) U.S. Cl.
CPC ......... *H10K 71/166* (2023.02); *C23C 14/042* (2013.01); *C23C 14/12* (2013.01); *C23C 14/24* (2013.01); *H10K 59/12* (2023.02); *H10K 71/00* (2023.02); *H10K 71/164* (2023.02)

(58) Field of Classification Search
CPC ... H01L 51/001; H01L 51/0011; H01L 51/56; C23C 14/04
See application file for complete search history.

(56) References Cited

U.S. PATENT DOCUMENTS

| 9,570,715 | B2 | 2/2017 | Kang |
| 10,014,471 | B2 | 7/2018 | Baek |
| 10,532,377 | B2 | 1/2020 | Hong et al. |
| 2016/0126507 | A1* | 5/2016 | Ko .................. C23C 14/042 438/34 |

(Continued)

FOREIGN PATENT DOCUMENTS

| KR | 10-2003-0027167 A | 4/2003 |
| KR | 10-2014-0030642 A | 3/2014 |

(Continued)

*Primary Examiner* — Jaehwan Oh
(74) *Attorney, Agent, or Firm* — Lewis Roca Rothgerber Christie LLP

(57) ABSTRACT

According to one or more embodiments, a mask assembly includes a mask frame including an opening and a portion surrounding the opening, and a mask arranged on the mask frame and including a first region and a second region, and a deposition material is passable through the first region corresponding to the opening, and the second region is around the first region, and the first region includes deposition openings, and the second region includes dummy openings, at least some of the dummy openings including centers arranged to deviate from a straight line connecting centers of the deposition openings, and a width of each of the deposition openings is the same as a width of each of the dummy openings.

32 Claims, 11 Drawing Sheets

(56) References Cited

U.S. PATENT DOCUMENTS

| | | | | |
|---|---|---|---|---|
| 2016/0312354 A1* | 10/2016 | Ko | ............... | H10K 71/00 |
| 2016/0343944 A1* | 11/2016 | Lee | ............... | H10K 59/35 |
| 2017/0179390 A1* | 6/2017 | Baek | ............... | B05C 21/005 |
| 2019/0378983 A1* | 12/2019 | Kim | ............... | C23C 14/042 |
| 2021/0108303 A1* | 4/2021 | Ahn | ............... | C23C 14/34 |
| 2021/0210735 A1* | 7/2021 | Kang | ............... | H10K 71/00 |
| 2021/0301386 A1* | 9/2021 | Bai | ............... | C23C 14/24 |

FOREIGN PATENT DOCUMENTS

| | | |
|---|---|---|
| KR | 10-2016-0122362 A | 10/2016 |
| KR | 10-2017-0075113 A | 7/2017 |

* cited by examiner

MASK ASSEMBLY, APPARATUS FOR MANUFACTURING DISPLAY DEVICE, AND METHOD OF MANUFACTURING DISPLAY DEVICE

CROSS-REFERENCE TO RELATED APPLICATION

This application claims priority to and the benefit of Korean Patent Application No. 10-2019-0140322, filed on Nov. 5, 2019 in the Korean Intellectual Property Office, the entire disclosure of which is incorporated herein by reference.

BACKGROUND

1. Field

Aspects of embodiments of the present disclosure relate to a mask assembly, an apparatus for manufacturing a display device, and a method of manufacturing a display device.

2. Description of Related Art

As the information society has developed, the demand for various types of display devices for displaying images has increased. The field of display devices has rapidly changed to thin, light, and large-area flat panel display devices (FPDs), which have replaced bulky cathode ray tubes (CRTs). Examples of FPDs include liquid crystal display devices (LCDs), plasma display panels (PDPs), organic light-emitting display devices (OLEDs), and electrophoretic display devices (EPDs).

Among the display devices, an OLED includes an organic light-emitting diode including an opposite electrode, a pixel electrode, and an emission layer. The electrodes and the emission layer may be formed using several methods, such as an independent deposition method. In the independent deposition method, a fine metal mask (FMM) is tensioned to be adhered to a mask frame and a deposition material is deposited on a deposition surface.

SUMMARY

According to aspects of one or more embodiments, a mask assembly robust to breakage when a fine metal mask is tensioned, an apparatus for manufacturing a display device, and a method of manufacturing a display device are provided.

Additional aspects will be set forth, in part, in the description which follows and, in part, will be apparent from the description, or may be learned by practice of the presented embodiments of the disclosure.

According to one or more embodiments, a mask assembly includes: a mask frame including an opening and a portion surrounding the opening, and a mask arranged on the mask frame and including a first region and a second region, wherein a deposition material is passable through the first region corresponding to the opening, and the second region is around the first region, wherein the first region includes deposition openings, and the second region includes dummy openings, wherein at least some of the dummy openings include centers arranged to deviate from a straight line connecting centers of the deposition openings, and a width of each of the deposition openings is the same as a width of each of the dummy openings.

A planar shape of each of the deposition openings and a planar shape of each of the dummy openings may be the same.

The dummy openings may include first openings and second openings, and the first openings may include centers arranged to deviate from the straight line connecting the centers of the deposition openings.

The second openings may include centers arranged to deviate from a straight line connecting the centers of the first openings, and the first openings and the second openings may be alternately arranged in a first direction from the deposition openings to the dummy openings.

The second openings may be arranged along the same straight line as the deposition openings.

Distances at which the second openings are arranged along the same straight line as the deposition openings may be constant.

A first distance between adjacent deposition openings from among the deposition openings may be the same as a second distance between adjacent dummy openings from among the dummy openings.

A width of the mask may be less than a width of the opening, and the mask assembly may include a plurality of masks including the mask arranged on the mask frame.

The second region may be between the first region and the mask frame.

The second region may surround at least part of the first region.

At least some of the dummy openings may be arranged along the same straight line as the deposition openings.

According to one or more embodiments, a mask assembly includes: a mask frame including an opening and a portion surrounding the opening, and a mask arranged on the mask frame and including a first region and a second region, wherein a deposition material is passable through the first region, and the second region is around the first region, wherein the first region includes a plurality of first portions configured to shield the deposition material and extending in a first direction, and a first portion from among the plurality of first portions is connected to a second portion from among a plurality of second portions that extend in a second direction crossing the first direction in the second region, and a width of a first portion from among the plurality of first portions is the same as a width of a second portion from among the plurality of second portions.

A first portion from among the plurality of first portions may be connected to a third portion from among a plurality of third portions that extend in a third direction crossing the first direction.

According to one or more embodiments, an apparatus for manufacturing a display device includes: a chamber in which a substrate is positionable, a deposition source located inside the chamber and configured to supply a deposition material into the chamber, and a mask assembly facing the deposition source and configured to pass the deposition material therethrough towards the substrate, wherein the mask assembly includes a mask frame including an opening and a portion surrounding the opening and a mask arranged on the mask frame and including a first region and a second region, wherein the deposition material is passable through the first region corresponding to the openings, and the second region is around the first region, wherein the first region includes deposition openings, and the second region includes dummy openings, wherein at least some of the dummy openings include centers arranged to deviate from a straight line connecting centers of the deposition openings, and a width of each of the deposition openings is the same as a width of each of the dummy openings.

A planar shape of each of the deposition openings and a planar shape of each of the dummy openings may be the same.

The dummy openings may include first openings and second openings, and the first openings may include centers arranged to deviate from the straight line connecting the centers of the deposition openings.

The second openings may include centers arranged to deviate from a straight line connecting the centers of the first openings, and the first openings and the second openings may be alternately arranged in a first direction from the deposition openings to the dummy openings.

The second openings may be arranged along the same straight line as the deposition openings.

Distances at which the second openings are arranged along the same straight line as the deposition openings may be constant.

A first distance between adjacent deposition openings from among the deposition openings may be the same as a second distance between adjacent dummy openings from among the dummy openings.

At least part of the dummy openings may be arranged along the same straight line as the deposition openings.

According to one or more embodiments, a method of manufacturing a display device includes: positioning a substrate within a chamber, supplying a deposition material into the chamber by using a deposition source located inside the chamber, and forming an organic layer on the substrate by using the deposition material that passes through a mask assembly facing the deposition source, wherein the mask assembly includes a mask frame including an opening and a portion surrounding the opening, and a mask arranged on the mask frame and including a first region and a second region, wherein the deposition material passes through the first region corresponding to the opening, and the second region is around the first region, wherein the first region includes deposition openings, and the second region includes dummy openings, wherein at least some of the dummy openings include centers arranged to deviate from a straight line connecting centers of the deposition openings, and a width of each of the deposition openings is the same as a width of each of the dummy openings.

A planar shape of each of the deposition openings and a planar shape of each of the dummy openings may be the same.

The dummy openings may include first openings and second openings, and the first openings may include centers arranged to deviate from the straight line connecting the centers of the deposition openings.

The second openings may include centers arranged to deviate from a straight line connecting the centers of the first openings, and the first openings and the second openings may be alternately arranged in a first direction from the deposition openings to the dummy openings.

The second openings may be arranged along the same straight line as the deposition openings.

Distances at which the second openings are arranged along the same straight line as the deposition openings may be constant.

A first distance between adjacent deposition openings from among the deposition openings may be the same as a second distance between adjacent dummy openings from among the dummy openings.

A width of the mask may be less than a width of the opening, and the mask assembly may include a plurality of masks including the mask arranged on the mask frame.

The second region may be between the first region and the mask frame.

The second region may surround at least part of the first region.

At least some of the dummy openings may be arranged along the same straight line as the deposition openings.

BRIEF DESCRIPTION OF THE DRAWINGS

The above and other aspects, features, and advantages of certain embodiments of the disclosure will be more apparent from the following description, taken in conjunction with the accompanying drawings, in which.

DETAILED DESCRIPTION

Figure 1:
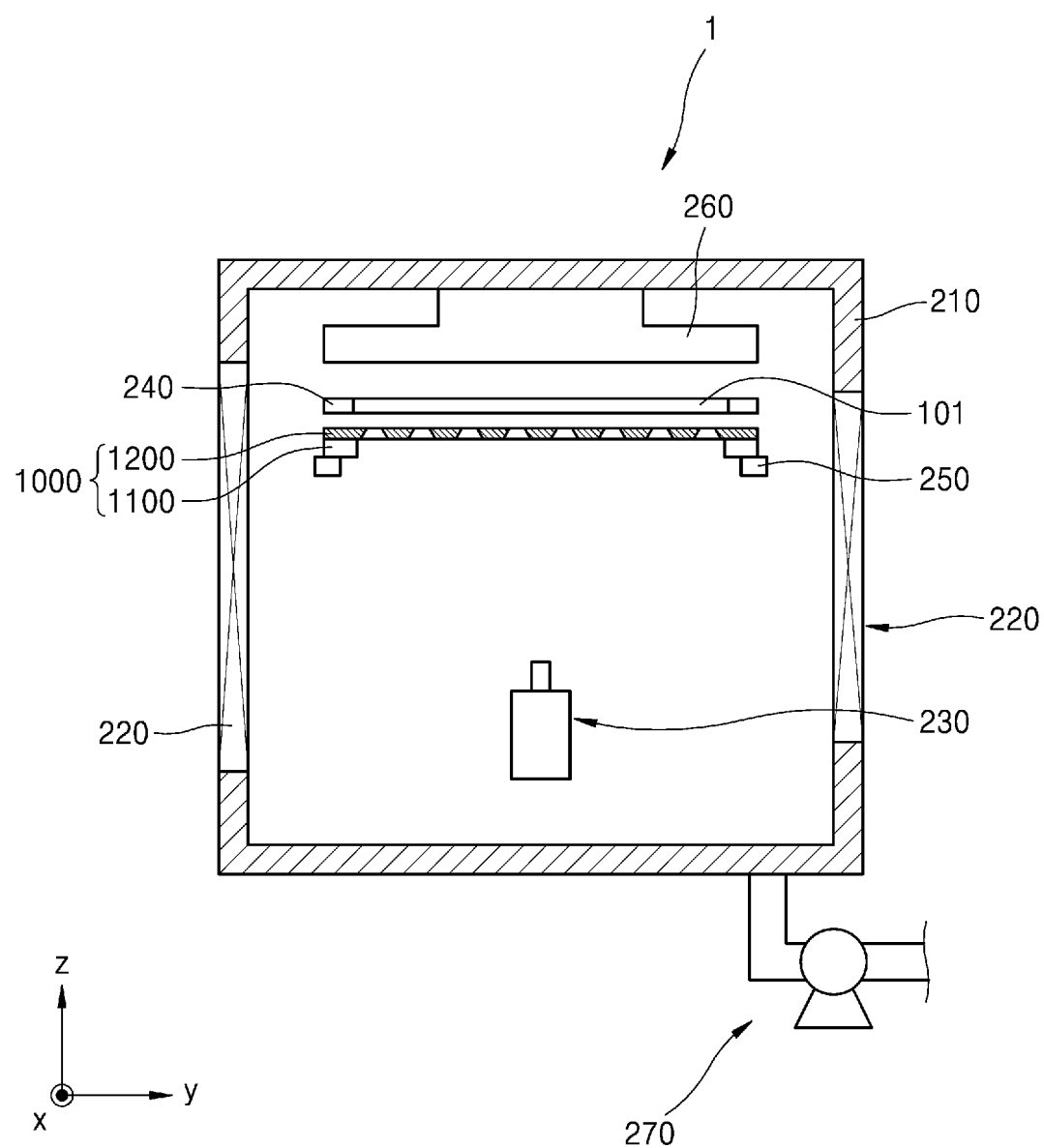
FIG. 1 is a cross-sectional view showing an apparatus for manufacturing a display device according to an embodiment.

Reference will now be made in further detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Herein, embodiments of the present disclosure will be described below in further detail with reference to the accompanying drawings. Those components that are the same or are in correspondence are given the same reference numeral regardless of the figure number, and a redundant description thereof may be omitted.

It is to be understood that although the terms "first," "second," etc. may be used herein to describe various components, these components should not be limited by these terms. These components are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on," another layer, region, or component, it may be directly or indirectly formed on the other layer, region, or component. That is, for example, one or more intervening layers, regions, or components may be present.

Sizes of elements in the drawings may be exaggerated or reduced for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It is to be understood that when a layer, region, or component is referred to as being "connected to" another layer, region, or component, it may be directly or indirectly connected to the other layer, region, or component. That is, for example, one or more intervening layers, regions, or components may be present. For example, it is to be understood that when a layer, region, or component is referred to as being "electrically connected to" another layer, region, or component, it may be directly or indirectly electrically connected to the other layer, region, or component. That is, for example, one or more intervening layers, regions, or components may be present.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
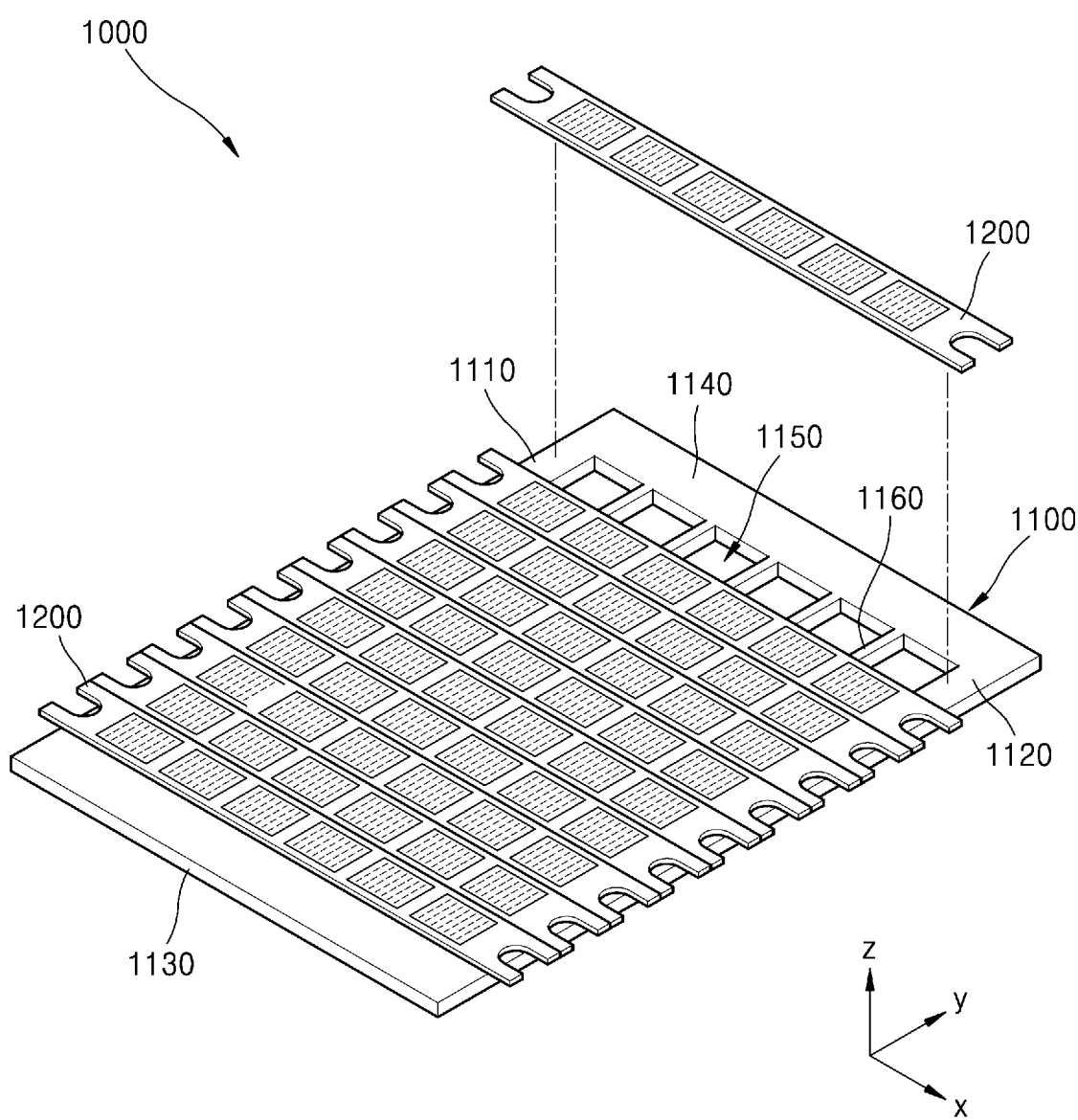
FIG. 2 is a perspective view illustrating a mask assembly according to an embodiment.
Figure 3:
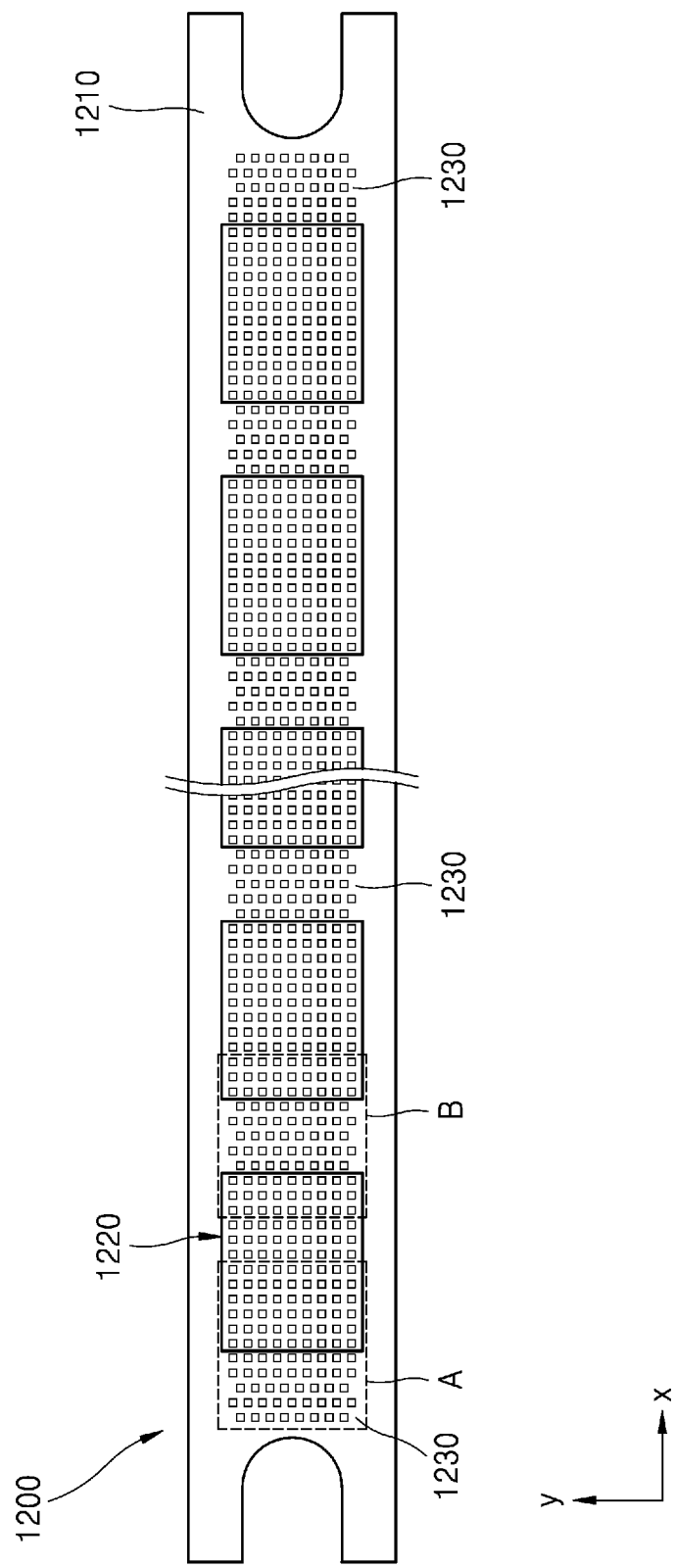
FIG. 3 is a plan view illustrating a mask according to an embodiment.

FIG. 1 is a cross-sectional view illustrating an apparatus 1 for manufacturing a display device according to an embodiment. FIG. 2 is a perspective view illustrating a mask assembly 1000 according to an embodiment. FIG. 3 is a plan view illustrating a mask 1200 according to an embodiment.

Referring to FIG. 1, the apparatus 1 for manufacturing the display device according to an embodiment may include a chamber 210, a shielding unit 220, a deposition source 230, a substrate supporting unit 240, a mask supporting unit 250, a magnetic force generation unit 260, a pressure controlling unit 270, and a mask assembly 1000.

The chamber 210 may have a space formed therein, and a side of the chamber 210 may be opened such that a substrate 101 may be drawn out of or accommodated in the chamber 210 through the opened side. In an embodiment, the shielding unit 220 including a gate valve may be located in the opened part of the chamber 210 and thus may be selectively opened or closed.

A deposition material for forming an organic layer on the substrate 101 may be accommodated in the deposition source 230. In an embodiment, energy (for example, thermal energy, light energy, vibrational energy) may be applied to the deposition source 230 such that the deposition material may be vaporized or sublimated in the deposition source 230.

The deposition source 230 described above may be replaceable. In this case, the deposition source 230 may be replaced with a new deposition source 230 when the accommodated deposition material is exhausted.

The substrate supporting unit 240 may support the substrate 101. In an embodiment, the substrate 101 may be seated on the substrate supporting unit 240 such that the substrate supporting unit 240 may support the substrate 101 and may adsorb or attach a surface of the substrate 101, thereby supporting the substrate 101. For example, the substrate supporting unit 240 may include a chamber, a bar, etc., which are fixed into the chamber 210. In another embodiment, the substrate supporting unit 240 may include a clamp for grasping the substrate 101. In another embodiment, the substrate supporting unit 240 may include an adhesive chuck or electrostatic chuck. In an embodiment, the substrate supporting unit 240 may be formed integrally with the magnetic force generation unit 260.

The mask supporting unit 250 may support a mask assembly 1000. In an embodiment, the mask supporting unit 250 may be the same as or similar to the substrate supporting unit 240 described above and, thus, herein, a further detailed description thereof will be omitted for convenience of explanation. Also, herein, a case in which the mask supporting unit 250 includes a frame fixed into the chamber 210 and the mask assembly 1000 is seated on the frame and supported thereon, will be described in further detail.

The magnetic force generation unit 260 may be located at the chamber 210 and may adhere a mask frame 1100 to the substrate 101. In an embodiment, the magnetic force generation unit 260 may include an electromagnet.

The pressure controlling unit 270 may be connected to the chamber 210 so as to control pressure inside the chamber 210. In an embodiment, the pressure controlling unit 270 may include a pipe connected to the chamber 210 and a pump located on the pipe.

The mask assembly 1000 may include the mask frame 1100 and the mask 1200.

Referring to FIGS. 2 and 3, the mask frame 1100 may include an opening 1150 through which the deposition material may pass, and a plurality of frames, or frame portions, that surround the opening 1150.

In an embodiment, the mask frame 1100 may include a first frame 1110 and a second frame 1120 that face each other, and a third frame 1130 and a fourth frame 1140 that face each other. For example, referring to FIG. 2, the first frame 1110 may extend in a y-direction and may be apart from the second frame 1120 in an x-direction. The third frame 1130 may extend in the x-direction and may be apart from the fourth frame 1140 in the y-direction. The first frame 1110 may be connected to the third frame 1130 and the fourth frame 1140, and the second frame 1120 may be connected to the third frame 1130 and the fourth frame 1140.

In an embodiment, the mask frame 1100 may be manufactured of metal having high rigidity that is a material with small deformation when the mask 1200 is welded.

In some embodiments, a support stick 1160, or support bar, may be provided in the opening 1150. For example, the support stick 1160 may extend in the y-direction and may be connected to the third frame 1130 and/or the fourth frame 1140 in FIG. 2. The support stick 1160 may prevent or substantially prevent a bending phenomenon due to the weight of the mask 1200 and may support the mask frame 1100.

The mask 1200 may be mounted on the mask frame 1100. In an embodiment, the mask 1200 may be manufactured of any of stainless steel, invar, nickel (Ni), cobalt (Co), a nickel alloy, and a nickel-cobalt alloy.

In an embodiment, a width of the mask 1200 may be less than a width of the opening 1150. For example, referring to FIG. 2, a width of the mask 1200 in the y-direction may be less than a width of the opening 1150 in the y-direction. Thus, a plurality of masks 1200 may be mounted on the mask frame 1100 to prevent or substantially prevent the mask frame 1100 from sagging due to the weight of the mask 1200. In another embodiment, the width of the mask 1200 may be greater than the width of the opening 1150. In an embodiment, for example, the width of the mask 1200 in the y-direction may be greater than the width of the opening 1150 in the y-direction. Thus, the mask 1200 may be integrally mounted on the mask frame 1100. Herein, a case in which the width of the mask 1200 is less than the width of the opening 1150 for convenience of explanation, will be described in further detail.

The mask 1200 may be consecutively arranged between the third frame 1130 and the fourth frame 1140. In an embodiment, both ends of the mask 1200 may be welded to and fixed onto the first frame 1110 and the second frame 1120. The mask 1200 may cover the opening 1150.

The mask 1200 may include a welding region 1210, a first region 1220, and a second region 1230.

The welding region 1210 may be at both ends of the mask 1200. The welding region 1210 may be a region connected to the mask frame 1100. For example, the welding region 1210 may be a region welded to, fixed to, and connected to the first frame 1110 or the second frame 1120.

The first region 1220 may be a region corresponding to the opening 1150. A plurality of deposition openings may be provided in each of a plurality of the first regions 1220, and the deposition material may pass through the mask 1200 through the plurality of deposition openings. In an embodiment, the first regions 1220 may be apart from one another by a certain distance. For example, the first regions 1220 may be apart from one another in the x-direction. In another embodiment, the first regions 1220 may be consecutively provided to correspond to the openings 1150. Herein, a case in which the first regions 1220 are apart from one another by a certain distance, will be described in further detail.

The second region 1230 may be around the first regions 1220. In an embodiment, the second region 1230 may surround at least part of the first region 1220. For example, when the first regions 1220 are apart from one another by a certain distance, each of the second regions 1230 may surround at least part of each of the first regions 1220. Also, each of the second regions 1230 may be between each of the first regions 1220 and the welding region 1210. In an embodiment, regions other than the first regions 1220 and the welding region 1210 in the mask 1200 may be the second regions 1230.

In an embodiment, each of the second regions 1230 may include dummy openings, and at least some of the dummy openings may include centers arranged to deviate from an imaginary straight line connecting centers of the deposition openings. Herein, a further detailed description thereof will be provided with reference to FIG. 4.

Figure 4:
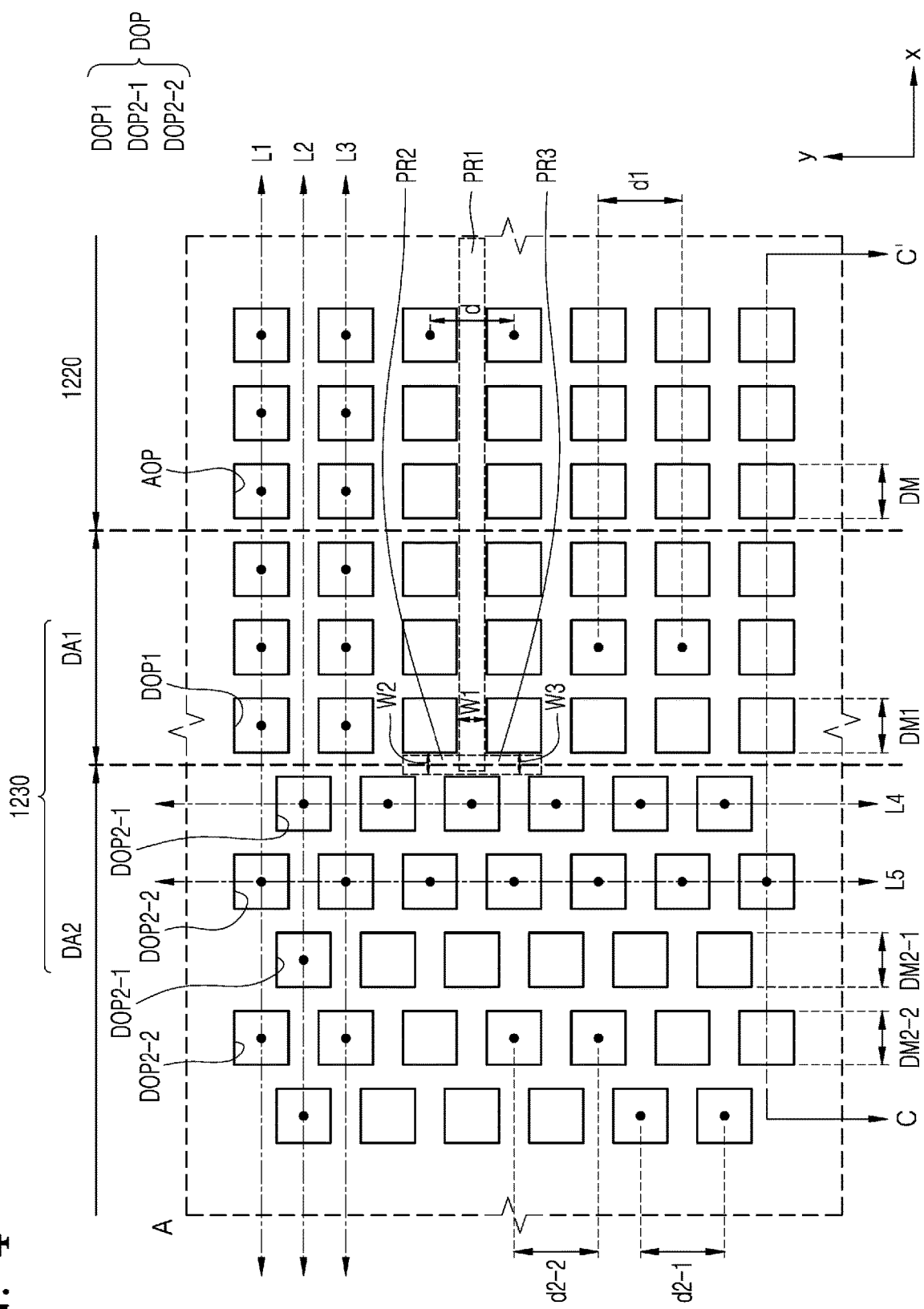
FIG. 4 is an enlarged view of a region "A" of FIG. 3.

FIG. 4 is an enlarged view of a region "A" of FIG. 3. In FIG. 4, like reference numerals with FIG. 3 represent like elements and, thus, repeated description thereof will be omitted.

Referring to FIG. 4, the first regions 1220 may include deposition openings AOP. In an embodiment, a plurality of deposition openings AOP may be apart from one another in a first direction or second direction. For example, the plurality of deposition openings AOP may be apart from one another in the x-direction or y-direction. Referring to FIG. 4, centers of the plurality of deposition openings AOP may be apart from one another by a certain distance along a first straight line L1 that extends in the first direction (for example, the x-direction). In an embodiment, the plurality of adjacent deposition openings AOP may be arranged at regular intervals. The first direction may be a direction in which a mask is tensioned.

In an embodiment, widths DM of the plurality of deposition openings AOP may be the same. Also, in an embodiment, shapes of the plurality of deposition openings AOP may be the same. The shapes of the deposition openings AOP may be any of various shapes including rectangular or polygonal shapes. In some embodiments, the widths of the plurality of deposition openings AOP may be different from one another, or the shapes of the plurality of deposition openings AOP may be different from one another. However, for convenience of explanation, a case in which the shapes of the plurality of deposition openings AOP are the same will be described in further detail.

The second region 1230 may include a first dummy region DA1 and a second dummy region DA2. The first dummy region DA1 may include a plurality of adjacent openings DOP1, and the second dummy region DA2 may include first openings DOP2-1 and second openings DOP2-2.

The adjacent openings DOP1 may be arranged in the same line as the deposition openings AOP. That is, the adjacent openings DOP1 may be arranged in the first dummy region DA1 in the first direction. For example, centers of the deposition openings AOP in the first region 1220 may be apart from one another by a certain distance along the first straight line L1. Centers of the adjacent openings DOP1 may be apart from one another by a certain distance along the first straight line L1, like in the centers of the deposition openings AOP. In this case, the adjacent openings DOP1 may be apart from one another by a certain distance.

The second dummy region DA2 may include openings including centers arranged to deviate from an imaginary straight line connecting centers of the deposition openings AOP. In further detail, first openings DOP2-1 may include centers arranged to deviate from an imaginary straight line connecting centers of the deposition openings AOP. Also, the first openings DOP2-1 may be arranged so as not to cross the adjacent openings DOP1. For example, centers of part of the plurality of deposition openings AOP may be apart from one another by a certain distance along the first straight line L1, and centers of part of the first openings DOP2-1 may be apart from one another by a certain distance along a second straight line L2 that extends in the first direction. Here, the second straight line L2 may be parallel to the first straight line L1 and apart from the first straight line L1 by a certain distance. Also, centers of another part of the plurality of deposition openings AOP may be apart from one another by a certain distance along a third straight line L3 that extends in the first direction. In this case, the second straight line L2 may be positioned between the first straight line L1 and the third straight line L3. In other words, centers of part of the first openings DOP2-1 may be positioned between the first straight line L1 and the third straight line L3. In an embodiment, a distance between the first straight line L1 and the second straight line L2 may be the same as a distance between the second straight line L2 and the third straight line L3. The arrangement of the deposition openings AOP and the first openings DOP2-1 may be repeated in a direction perpendicular to the first straight line L1 (for example, the y-direction). Thus, the first openings DOP2-1 may be arranged so as not to cross the deposition openings AOP.

In the present embodiment, the second openings DOP2-2 may be arranged in the same line as the deposition openings AOP. For example, centers of part of the plurality of second openings DOP2-2 may be apart from one another by a certain distance along the first straight line L1 or the third straight line L3. In further detail, centers of part of the second openings DOP2-2 may overlap the first straight line L1 or the third straight line L3. The arrangement of the deposition openings AOP and the second openings DOP2-2 may be repeated in a direction perpendicular to the first straight line L1 or the third straight line L3 (for example, the y-direction). Thus, the second openings DOP2-2 may include centers arranged to deviate from an imaginary straight line connecting centers of the first openings DOP2-1.

The first openings DOP2-1 and the second openings DOP2-2 described above may be alternately arranged in the first direction (for example, a-x-direction). In further detail, for example, centers of the first openings DOP2-1 may be apart from one another by a certain distance in a fourth straight line L4 in the y-direction, and centers of the second openings DOP2-2 may be apart from one another by a certain distance in a fifth straight line L5 in the y-direction. The arrangement of the first openings DOP2-1 and the second openings DOP2-2 may be repeated in the first direction.

In the present embodiment, distances between adjacent openings may be the same. In further detail, a distance d between the deposition openings AOP may be the same (equal or substantially equal) as a distance d1 between the adjacent openings DOP1. Also, the distance d1 between the adjacent openings DOP1 may be the same as a distance d2-1 between the first openings DOP2-1 and may be the same as a distance d2-2 between the second openings DOP2-2. Here, a distance between openings is a distance between centers of adjacent openings.

In the present embodiment, shapes of the plurality of dummy openings DOP may be the same. In further detail, in an embodiment, shapes of the adjacent openings DOP1, the first openings DOP2-1, and the second openings DOP2-2 may be the same. In an embodiment, planar shapes of the plurality of dummy openings DOP may be the same polygonal shapes, such as rectangular shapes, diamond shapes, or hexagonal shapes.

In an embodiment, widths of the plurality of dummy openings DOP may be the same. In further detail, in an embodiment, widths DM1 of the adjacent openings DOP1, widths DM2-1 of the first openings DOP2-1, and widths DM2-2 of the second openings DOP2-2 may be the same. In FIG. 4, widths of openings are shown as a distance between protrusions inside the openings (see FIG. 5).

From a different point of view, the mask 1200 may include first portions PR1, second portions PR2, and third portions PR3. One of the first portions PR1 may be connected to the second portions PR2 that extend in the second direction, and to the third portions PR3 that extend in the third direction.

The first regions 1220 may include a plurality of first portions PR1 that shield the deposition material and extend in the first direction. Here, the first portions PR1 may be a region passing between adjacent deposition openings AOP in the first direction among portions of the mask 1200. For example, the first portions PR1 may be a region passing between adjacent deposition openings AOP in the-x-direction among portions of the mask. The first portions PR1 may extend from the first region 1220 into the first dummy regions DA1.

A first portion PR1 from among the first portions PR1 may be connected to a second portion PR2 from among the plurality of second portions PR2 that extend in the second direction crossing the first direction in the second region. Here, the second portions PR2 may be defined as a region passing between the adjacent openings DOP1 and the first openings DOP2-1 in the second direction among the portions of the mask 1200. The second portions PR2 may extend in a direction crossing the-x-direction. Referring to FIG. 4, the second portions PR2 may extend in the y-direction.

A first portion PR1 from among the first portions PR1 may be connected to a third portion PR3 from among the plurality of third portions PR3 that extend in a third direction crossing the first direction. Here, the third portions PR3 may be defined as a region passing between the adjacent openings DOP1 and the first openings DOP2-1 in the third direction among the portions of the mask 1200. The third portions PR3 may extend in a direction crossing the-x-direction. Referring to FIG. 4, the third portions PR3 may extend in a-y-direction.

In an embodiment, widths W1 of the first portions PR1, widths W2 of the second portions PR2, and widths W3 of the third portions PR3 may be the same (equal or substantially equal). Here, each of the widths W1 of the first portions PR1 may be a vertical distance between the adjacent deposition openings AOP. Each of the widths W2 of the second portions PR2 and each of the widths W3 of the third portions PR3 may be horizontal distances between the adjacent openings DOP1 and the first openings DOP2-1.

Figure 5:
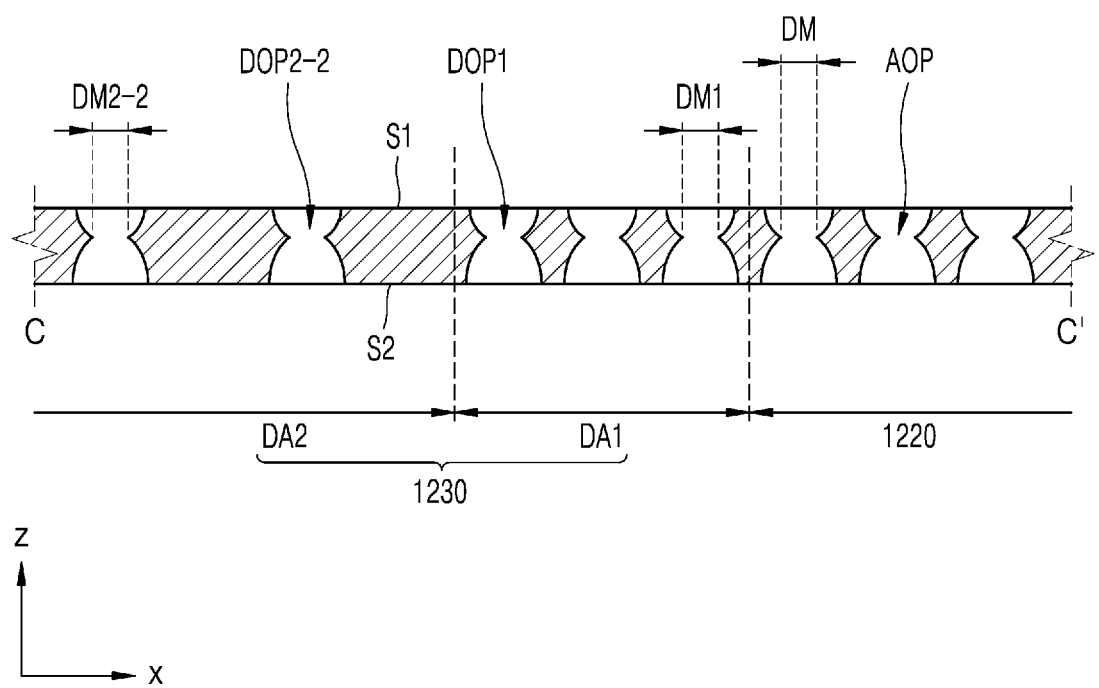
FIG. 5 is a cross-sectional view of the mask of FIG. 4, taken along the line C-C'.

FIG. 5 is a cross-sectional view of the mask 1200, taken along the line C-C' of FIG. 4. In FIG. 5, like reference numerals with FIG. 4 represent like elements and, thus, repeated description thereof will be omitted.

Referring to FIG. 5, in an embodiment, openings may be formed using chemical etching. For example, after a first surface S1 is etched to a certain depth, a second surface S2 may be etched to a certain depth and, thus, openings may be formed. In another embodiment, the openings may be formed by radiating a laser. Herein, a case in which the openings are formed using chemical etching will be described in further detail.

In an embodiment, widths DM of the deposition openings AOP may be the same (equal or substantially equal) as widths DM1 of the adjacent openings DOP1 and widths DM2 of the second openings DOP2-2. Although not shown in FIG. 5, widths of the first openings may be the same as the widths DM of the deposition openings AOP. Here, the width of an opening is a distance between protrusions inside the opening.

In an embodiment, widths of openings formed in the first surface S1 may be the same. Widths of the openings formed in the second surface S2 opposite to the first surface S1 may be the same.

Shapes of the deposition openings AOP in the first region 1220 and shapes of the adjacent openings DOP1 and the second openings DOP2-2 in the second region 1230 may be the same. Although not shown in FIG. 5, in an embodiment, shapes of the first openings and the second openings DOP2-2 may be the same.

In an embodiment, shapes of the deposition openings AOP and shapes of the adjacent openings DOP1, the first openings DOP2-1, and the second openings DOP2-2 that are the same mean that planar shapes and cross-sectional shapes of the openings are the same. That is, three-dimensional shapes of the openings may be the same.

Figure 6:
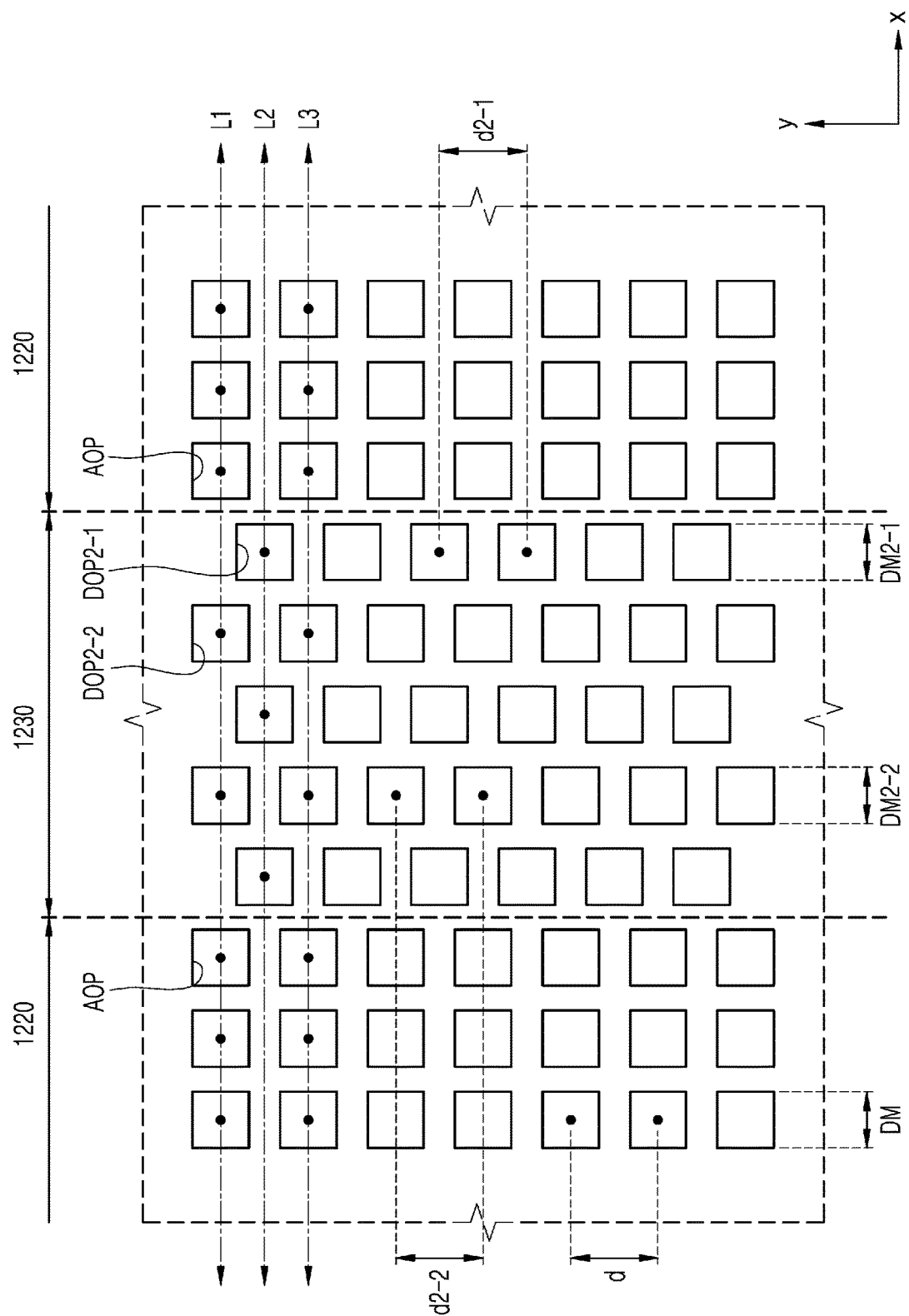
FIG. 6 is an enlarged view of a region "B" of FIG. 3.

FIG. 6 is an enlarged view of a region "B" of FIG. 3. In FIG. 6, like reference numerals with FIG. 3 represent like elements, and, thus, repeated description thereof will be omitted.

Referring to FIG. 6, the first regions 1220 may be apart from one another by a certain distance. For example, the first regions 1220 may be apart from one another in the x-direction.

The second regions 1230 may be around the first regions 1220. In an embodiment, the second regions 1230 may be between the first regions 1220 that are apart from one another. In this case, the second regions 1230 may include dummy openings, and at least some of the dummy openings may include centers arranged to deviate from an imaginary straight line connecting centers of the deposition openings. In another embodiment, the second regions 1230 may not be arranged between the first regions 1220 that are apart from one another. Herein, for convenience of explanation, a case in which the second regions 1230 are between the first regions 1220 that are apart from one another will be described in further detail.

The first regions 1220 may include deposition openings AOP, and the second regions 1230 may include dummy openings DOP. The dummy openings DOP may include adjacent openings, first openings DOP2-1, and second openings DOP2-2. In some embodiments, the adjacent openings may be omitted, and FIG. 6 illustrates that the adjacent openings are omitted.

The first openings DOP2-1 may include centers arranged to deviate from an imaginary straight line connecting centers of the deposition openings AOP, and the second openings DOP2-2 may include centers arranged to deviate from an imaginary straight line connecting centers of the first openings DOP2-1. In an embodiment, the second openings DOP2-2 and the deposition openings AOP may be arranged in the same line.

Due to the arrangement of the openings in the present embodiment, the mask may be robust to breakage. When an organic light-emitting display device is manufactured, a fine metal mask is tensioned to be adhered to the mask frame, and a material, such as an organic layer, is deposited onto a surface of the substrate so as to form an organic layer with a certain pattern. In this case, generally, a large stress may be generated in the second regions 1230 from among the regions of the mask. In the present embodiment, the second openings DOP2-2 included in the second regions 1230 may be arranged so as to deviate from an imaginary straight line connecting centers of the first openings DOP2-1 such that a tensile force may be dispersed in the direction in which the mask is tensioned. Thus, the mask that is robust to breakage may be manufactured.

Also, deformation of the mask due to the stress may be minimized or reduced such that locations of the substrate and a mask assembly may be prevented or substantially prevented from being out of place.

From a different point of view, the second portions PR2 and the third portions PR3 may be provided in a different direction from the direction in which the first portions PR1 are provided. Thus, the tensile force applied to the first portions PR1 may be dispersed into the second portions PR2 and the third portions PR3. Thus, in an embodiment of the present disclosure, a stress may be prevented or substantially prevented from being concentrated into part of the second regions 1230, and the mask that is robust to breakage may be manufactured.

Because, in an embodiment, shapes of the dummy openings and shapes of the deposition openings are the same, a magnetic force generated by the magnetic force generation unit may be uniformly or substantially uniformly formed in the whole of the mask.

Figure 7:
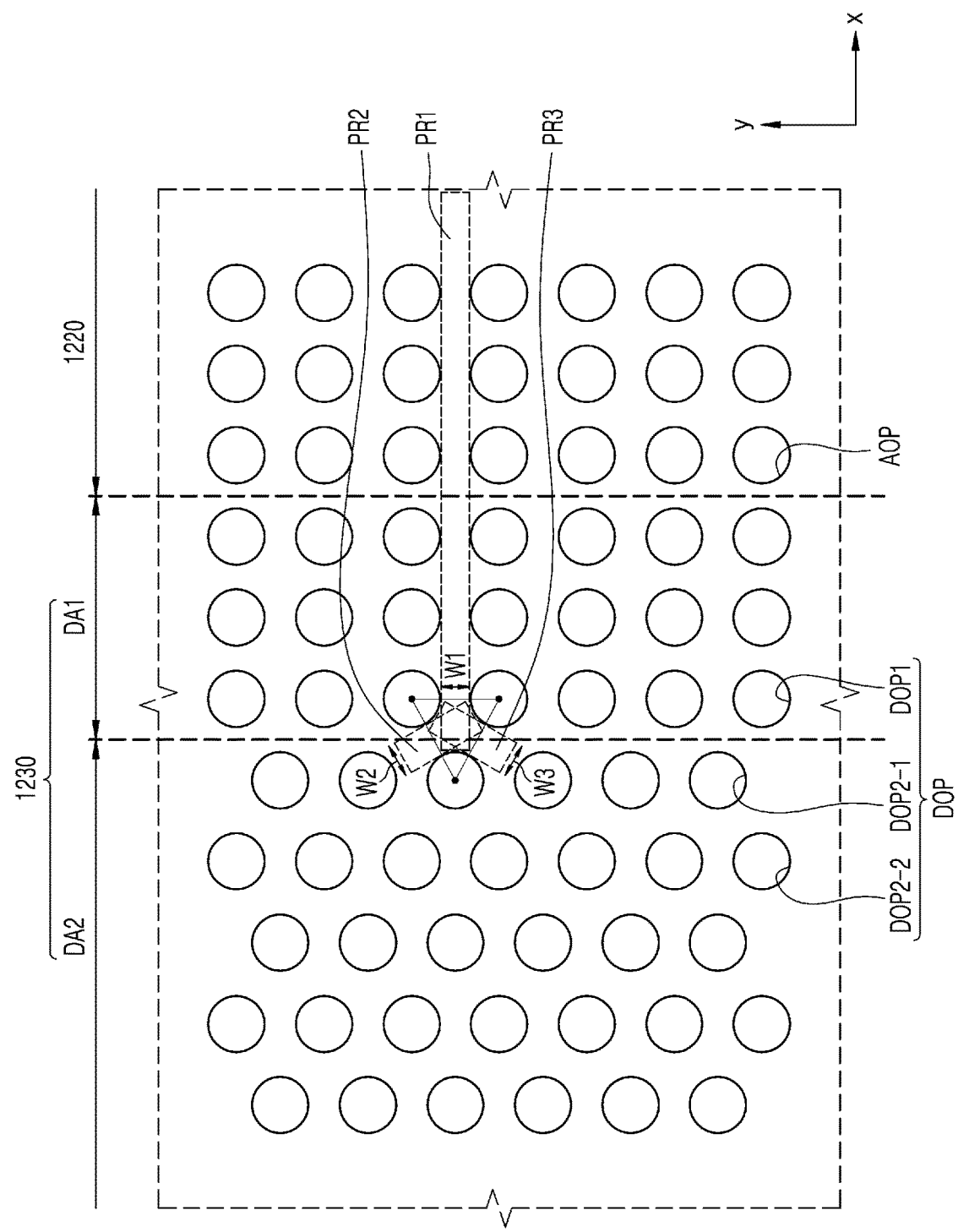
FIG. 7 is a plan view illustrating part of a mask according to another embodiment.

FIG. 7 is a plan view illustrating part of a mask according to another embodiment. In FIG. 7, like reference numerals with FIG. 4 represent like elements. Thus, further detailed description thereof will be omitted.

Referring to FIG. 7, the first regions 1220 may include deposition openings AOP. The second regions 1230 may include a first dummy region DA1 and a second dummy region DA2. The first dummy region DA1 may include adjacent openings DOP1, and the second dummy region DA2 may include first openings DOP2-1 and second openings DOP2-2.

In an embodiment, the deposition openings AOP and the dummy openings DOP may have the same shapes. For example, the deposition openings AOP and the dummy openings DOP may be circular in a plane. In FIG. 7, the deposition openings AOP and the dummy openings DOP are shown circular in a plane. However, there may be various modifications wherein the deposition openings AOP and the dummy openings DOP may be oval in a plane, for example.

A mask 1200 may include first portions PR1, second portions PR2, and third portions PR3. A first portion PR1 from among the first portions PR1 may be connected to the second portions PR2 that extend in the second direction and the third portions PR3 that extend in the third direction.

The first regions 1220 may include a plurality of first portions PR1 that shield the deposition material and extend in the first direction. Here, the first portions PR1 may be a region in which the deposition material passes through the adjacent deposition openings AOP from among portions of the mask. The first portions PR1 may extend from the first regions 1220 to the first dummy region DA1. For example, the first portions PR1 may extend in the-x-direction.

A first portion PR1 from among the first portions PR1 may be connected to a second portion PR2 from among the plurality of second portions PR2 that extends in a second direction crossing the first direction in the second regions 1230. Here, the second portions PR2 may be defined as a region passing between the adjacent openings DOP1 and the first openings DOP2-1 in the second direction among the portions of the mask 1200. Referring to FIG. 5, the second portions PR2 may extend in a direction that crosses the-x-direction.

A first portion PR1 from among the first portions PR1 may be connected to a third portion PR3 from among the plurality of third portions PR3 that extends in a third direction crossing the first direction. Here, the third portions PR3 may be defined as a region passing between the adjacent openings DOP1 and the first openings DOP2-1 in the third direction among the portions of the mask 1200. Referring to FIG. 5, the third portions PR3 may extend in a direction that crosses the-x-direction. In this case, the direction in which the third portions PR3 extend may be different from the direction in which the second portions PR2 extend.

Widths W1 of the first portions PR1, widths W2 of the second portions PR2, and widths W3 of the third portions PR3 may be the same (equal or substantially equal). Here, each of the widths W1 of the first portions PR1 may be a shortest distance between the adjacent deposition openings AOP. Each of the widths W2 of the second portions PR2 and each of the widths W3 of the third portions PR3 may be a shortest distance between the adjacent openings DOP1 and the first openings DOP2-1.

The mask 1200 may be tensioned in the first direction (for example, the x-direction). In an embodiment, when the dummy openings DOP and the deposition openings AOP are arranged in a welding region of the mask to be parallel to one another, the first portions PR1 may extend into the welding region. In this case, a full tensile force may be applied to the first portions PR1 in the first direction such that the stress may not be dispersed.

In the present embodiment, the second portions PR2 and the third portions PR3 are provided in a different direction from the direction in which the first portions PR1 are provided. Thus, the tensile force applied to the first portions PR1 may be dispersed into the second portions PR2 and the third portions PR3. Thus, in the present embodiment, the stress may be prevented or substantially prevented from being concentrated into part of the second regions 1230, and a mask that is robust to breakage may be manufactured.

Figure 8:
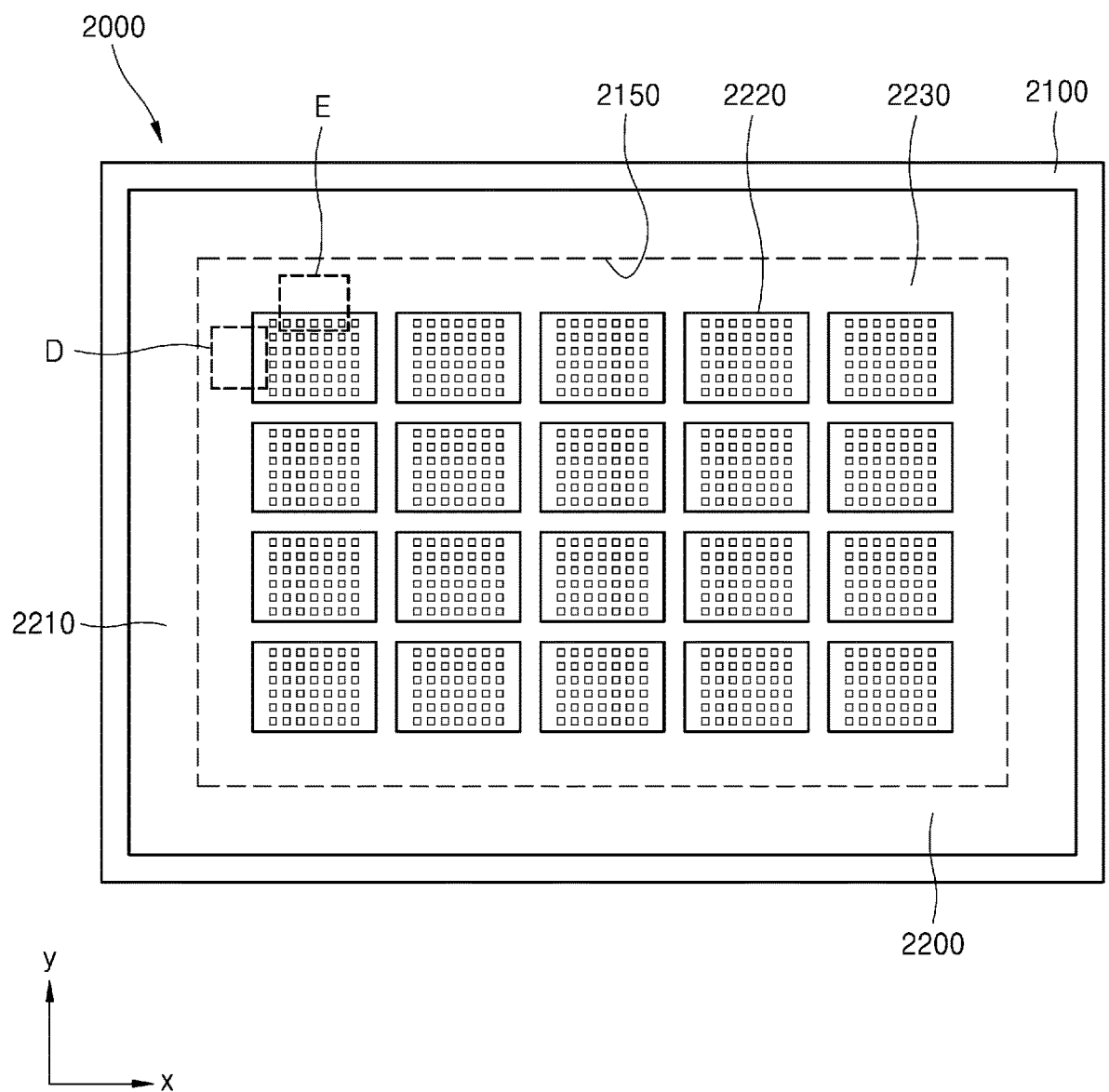
FIG. 8 is a plan view illustrating a mask assembly according to another embodiment.
Figure 9:
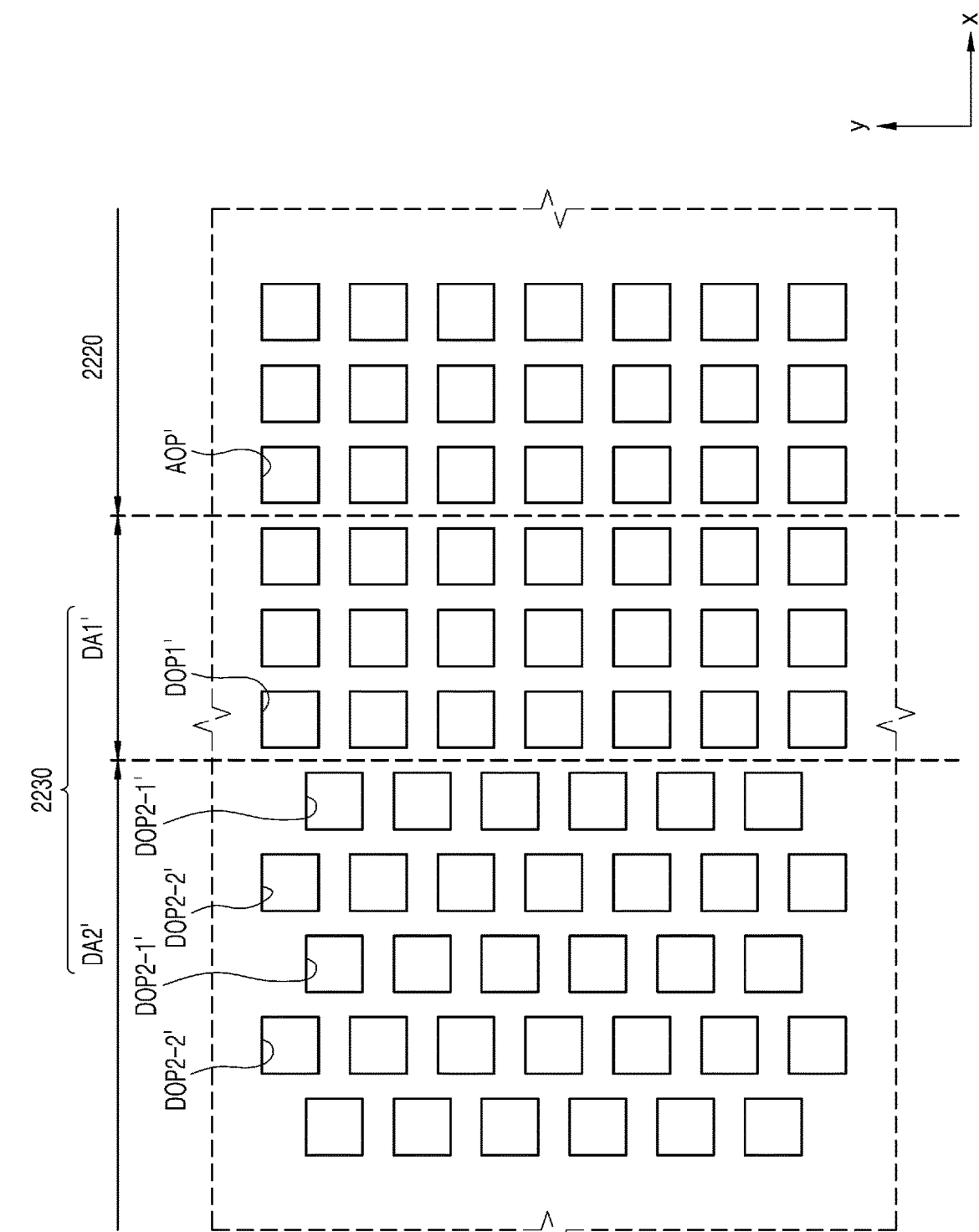
FIG. 9 is an enlarged view of a region "D" of FIG. 8.
Figure 10:
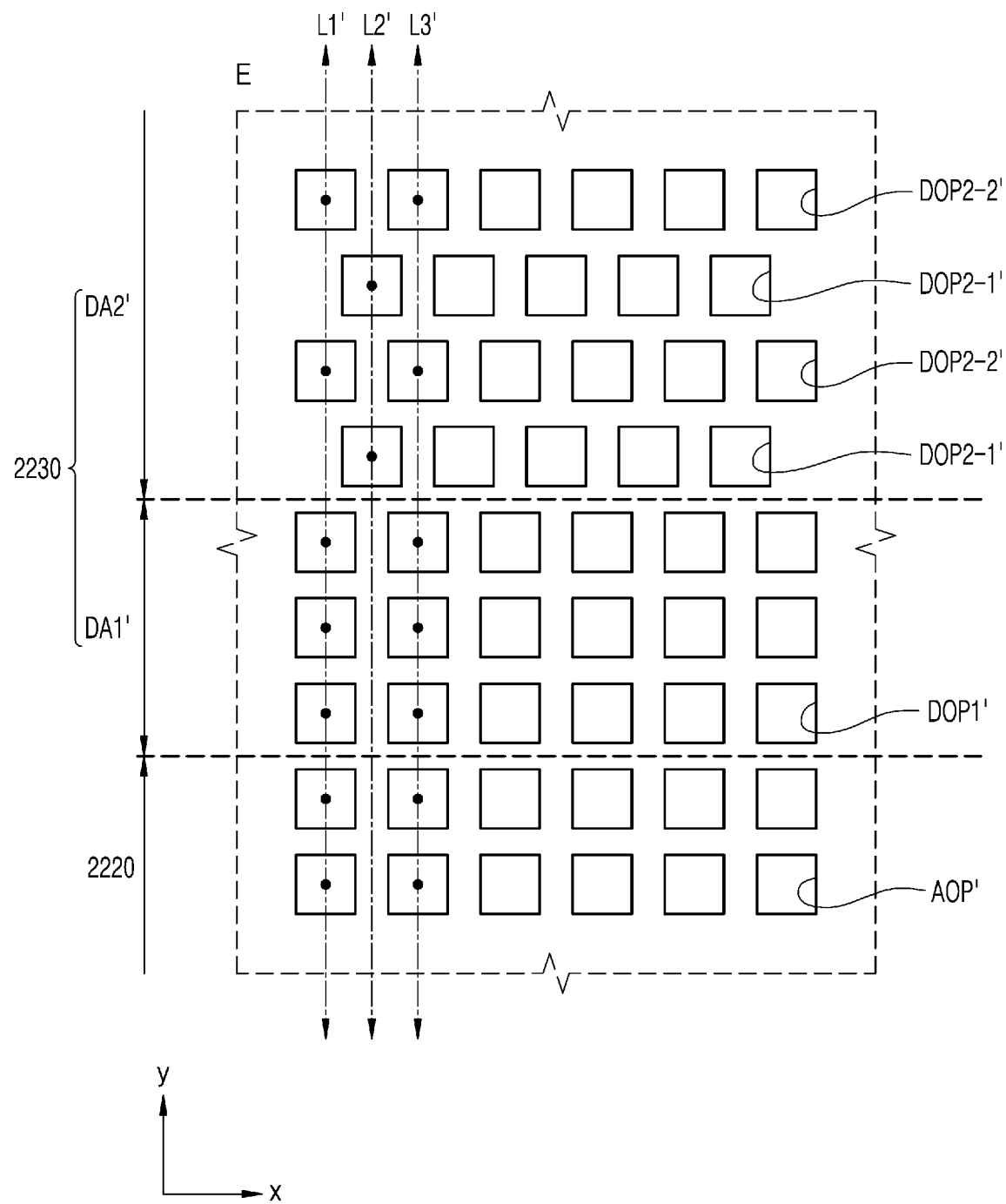
FIG. 10 is an enlarged view of a region "E" of FIG. 8.

FIG. 8 is a plan view illustrating a mask assembly 2000 according to another embodiment; FIG. 9 is an enlarged view of a region "D" of FIG. 8; and FIG. 10 is an enlarged view of a region "E" of FIG. 8.

Referring to FIG. 8, the mask assembly 2000 may include a mask frame 2100 and a mask 2200. The mask frame 2100 may include an opening 2150 through which the deposition material may pass, and a plurality of frames or frame portions that surround the opening 2150. The mask frame 2100 and the openings 2150 of FIG. 8 are similar to the mask frame 1100 and the opening 1150 of FIG. 2. Thus, further detailed description thereof will be omitted.

In an embodiment, the mask 2200 may be mounted on the mask frame 2100. In an embodiment, a width of the mask 2200 may be greater than a width of the openings 2150. For example, a width of the mask 2200 in the x-direction or the y-direction may be greater than a width of the opening 2150 in the x-direction or the y-direction. Thus, in an embodiment, the mask 2200 may be integrally mounted on the mask frame 2100.

In an embodiment, the mask 2200 may be tensioned in the x-direction or y-direction and thus may be mounted on the mask frame 2100. Thus, a stress may be generated in the mask 2200 in the x-direction and y-direction.

The mask 2200 may include a welding region 2210, first regions 2220, and second regions 2230. The welding region 2210, the first regions 2220, and the second regions 2230 of FIG. 8 are the same as or similar to the welding region 1210, the first regions 1220, and the second regions 1230 of FIG. 3. Thus, further detailed description thereof will be omitted.

In the present embodiment, the second regions 2230 may surround the first regions 2220. For example, when the first regions 2220 may be apart from one another by a certain distance, the second regions 2230 may surround the first regions 2220, respectively. Also, the second regions 2230 may be between the first regions 2220 and the welding region 2210.

The second regions 2230 may include dummy openings, wherein at least some of the dummy openings may include centers arranged to deviate from an imaginary straight line connecting centers of the deposition openings. Thus, in an embodiment, the dummy openings may surround the first regions 2220, respectively.

Referring to FIGS. 9 and 10, the first regions 2220 may include deposition openings AOP'. The second regions 2230 may include a first dummy region DA1' and a second dummy region DA2'. The first dummy region DA1' may include adjacent openings DOP1', and the second dummy region DA2' may include first openings DOP2-1' and second openings DOP2-2'.

The first dummy region DA1', the second dummy region DA2', the deposition openings AOP', the adjacent openings DOP1', the first openings DOP2-1', and the second openings DOP2-2' of FIG. 9 may be the same as or similar to the first dummy region DA1, the second dummy region DA2, the deposition openings AOP, the adjacent openings DOP1, the first openings DOP2-1, and the second openings DOP2-2 of FIG. 4. Thus, further detailed description thereof will be omitted.

A first straight line L1', a second straight line L2', and a third straight line L3' of FIG. 10 may be straight lines that extend in the y-direction and are apart from one another.

In an embodiment, the adjacent openings DOP1' may be arranged in the same line as the deposition openings AOP'. That is, the adjacent openings DOP1' may be arranged in the first dummy region DA1' in the first direction. For example, centers of the deposition openings AOP' may be arranged to be apart from one another by a certain distance along the first straight line L1' in the y-direction. Centers of the adjacent openings DOP1' may be arranged to be apart from one another by a certain distance along the first straight line L1' as in the centers of the deposition openings AOP'. In this case, the adjacent openings DOP1' may be arranged to be apart from one another by a certain distance.

The second dummy region DA2' may include centers arranged to deviate from an imaginary straight line connecting centers of the deposition openings AOP'. In further detail, the first openings DOP2-1' may be arranged so as not to cross the deposition openings AOP'. Also, the first openings DOP2-1' may be arranged so as not to cross the adjacent openings DOP1'. For example, centers of some of the plurality of deposition openings AOP' may be arranged to be apart from one another by a certain distance along the first straight line L1', and centers of part of the first openings DOP2-1' may be arranged to be apart from one another by a certain distance along the second straight line L2' that extends in the first direction. Here, the second straight line L2' may be a straight line that is parallel to the first straight line L1' and apart from the first straight line L1' by a certain distance. Also, centers of others of the plurality of deposition openings AOP' may be arranged to be apart from one another by a certain distance along a third straight line L3' that extends in the first direction. In this case, the second straight line L2' may be between the first straight line L1' and the third straight line L3'. In other words, centers of some of the first openings DOP2-1' may be located between the first straight line L1' and the third straight line L3'. In an embodiment, a distance between the first straight line L1' and the second straight line L2' may be the same as a distance between the second straight line L2' and the third straight line L3'. The arrangement of the deposition openings AOP' and the first openings DOP2-1' may be repeated in a direction perpendicular to the first straight line L1' (for example, the x-direction). Thus, the first openings DOP2-1' may be arranged so as not to cross the deposition openings AOP'.

In the present embodiment, the second openings DOP2-2' may be arranged in the same line as the deposition openings AOP'. For example, centers of some of the plurality of second openings DOP2-2' may be arranged to be apart from one another by a certain distance along the first straight line L1' or the third straight line L3'. In further detail, centers of some of the second openings DOP2-2' may overlap the first straight line L1' or the third straight line L3'. The arrangement of the deposition openings AOP' and the second openings DOP2-2' may be repeated in a direction perpendicular to the first straight line L1' or the third straight line L3' (for example, the x-direction). Thus, the second openings DOP2-2' may include centers arranged to deviate from an imaginary straight line connecting centers of the first openings DOP2-1'.

The first openings DOP2-1' and the second openings DOP2-2' may be alternately arranged in the first direction (for example, the y-direction).

The arrangement of the openings as in the present embodiment is performed such that the mask may be robust to breakage. In the present embodiment, the mask 2200 may be tensioned in the x-direction and the y-direction, and a stress may be generated in the x-direction and the y-direction. In this case, the second openings DOP2-2' arranged in the second regions 2230 adjacent to the welding region 2210 may be arranged to deviate from an imaginary straight line connecting centers of the first openings DOP2-1' such that a tensile force may be dispersed in a direction in which the mask is tensioned. Thus, the mask that is robust to breakage may be manufactured.

Also, deformation of the mask due to the stress may be minimized or reduced such that locations of the substrate and the mask assembly may be prevented or substantially prevented from being out of place.

In an embodiment, because shapes of the dummy openings and shapes of the deposition openings are the same, a magnetic force generated by the magnetic force generation unit may be uniformly or substantially uniformly formed in the whole mask.

Referring back to FIG. 1, an organic layer may be deposited onto the substrate 101 using the apparatus 1 for manufacturing the display device described above.

First, the substrate 101 may be arranged in the chamber 210. In further detail, the substrate 101 may be mounted on the substrate supporting unit 240.

Next, the deposition material may be supplied into the chamber 210 using the deposition source 230 located inside the chamber 210.

Next, the deposition material that passes through the mask assembly 1000 facing the deposition source 230 may be deposited onto the substrate 101, and an organic layer may be formed.

Herein, a display device 100 that may be manufactured using the apparatus 1 for manufacturing the display device described above will be described.

The display device 100 that is a device for displaying an image, may be a portable mobile device, such as a game machine, a multimedia device, or a personal computer (PC) (e.g., a miniature PC). Examples of the display device 100 may include a liquid crystal display device, an electrophoretic display device, an organic light-emitting display device, an inorganic electro-luminescence (EL) display device, a field emission display device, a surface-conduction electron-emitter display device, a quantum dot display device, a plasma display device, and a cathode ray display device. Herein, an organic light-emitting display device will be described as an example of a display device 100 according to an embodiment. However, according to embodiments, any of a variety of types of display devices described above may be used.

Figure 11:
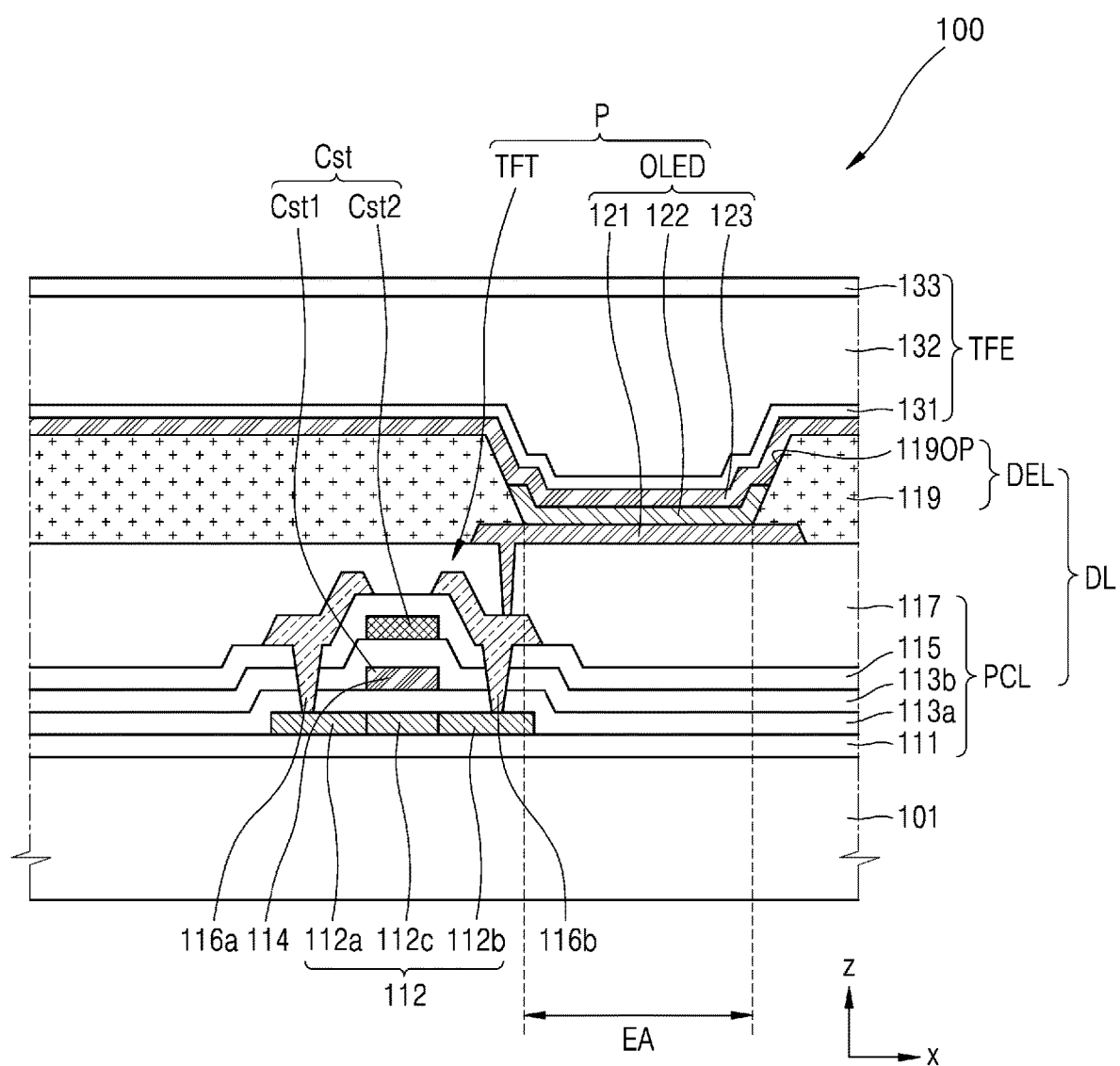
FIG. 11 is a cross-sectional view schematically illustrating a display device manufactured by an apparatus for manufacturing a display device, according to an embodiment.

FIG. 11 is a cross-sectional view schematically illustrating the display device 100 manufactured by an apparatus for manufacturing a display device, according to an embodiment.

Referring to FIG. 11, a display layer DL and a thin-film encapsulation layer TFE may be located on a substrate 101. The display layer DL may include a pixel circuit layer PCL and a display element layer DEL.

The substrate 101 may include glass or a polymer resin, such as any of polyethersulfone, polyarylate, polyetherimide, polyethylene naphthalate, polyethylene terephthalate, polyphenylene sulfide, polyimide, polycarbonate, and cellulose acetate propionate.

A barrier layer (not shown) may be further included between the display layer DL and the substrate 101. The barrier layer (not shown) that is a barrier layer for preventing or substantially preventing penetration of external foreign substances may have a single layer or multi-layer structure including an inorganic material, such as silicon nitride ($SiN_x$, where x>0) or silicon oxide ($SiO_x$, where x>0).

The pixel circuit layer PCL is located on the substrate 101. FIG. 11 illustrates that the pixel circuit layer PCL includes a thin-film transistor TFT, a buffer layer 111 located under or on components of the thin-film transistor TFT, a first gate insulating layer 113a, a second gate insulating layer 113b, an interlayer insulating layer 115, and a planarization insulating layer 117.

In an embodiment, the buffer layer 111 may include an inorganic insulating material, such as silicon nitride, silicon oxynitride, and silicon oxide, and may have a single layer or multi-layer structure including any of the inorganic insulating materials described above.

The thin-film transistor TFT may include a semiconductor layer 112, and, in an embodiment, the semiconductor layer 112 may include polysilicon. In an embodiment, the semiconductor layer 112 may include amorphous silicon, an oxide semiconductor, or an organic semiconductor. The semiconductor layer 112 may include a channel region 112c and a drain region 112a and a source region 112b, which are located at both sides of the channel region 112c. A gate electrode 114 may overlap the channel region 112c.

The gate electrode 114 may include any of low resistance metal materials. The gate electrode 114 may include any of conductive materials including molybdenum (Mo), aluminum (Al), copper (Cu), and titanium (Ti), and may have a multi-layer or single layer structure including any of the materials described above.

The first gate insulating layer 113a between the semiconductor layer 112 and the gate electrode 114 may include any of inorganic insulating materials, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113b may cover the gate electrode 114. The second gate insulating layer 113b may include any of inorganic insulating materials, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), as in the first gate insulating layer 113a.

An upper electrode Cst2 of a storage capacitor Cst may be located on the second gate insulating layer 113b. The upper electrode Cst2 may overlap the gate electrode 114 thereunder. In an embodiment, the gate electrode 114 and the upper electrode Cst2 that overlap each other with the second gate insulating layer 113b therebetween, may form a storage capacitor Cst. That is, the gate electrode 114 may function as a lower electrode Cst1 of the storage capacitor Cst.

In this way, the storage capacitor Cst and the thin-film transistor TFT may overlap each other. In some embodiments, the storage capacitor Cst may not overlap the thin-film transistor TFT.

The upper electrode Cst2 may include aluminium (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The interlayer insulating layer 115 may cover the upper electrode Cst2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may have a single layer or multi-layer structure including any of the inorganic insulating materials described above.

Each of the drain electrode 116a and the source electrode 116b may be located on the interlayer insulating layer 115. The drain electrode 116a and the source electrode 116b may include any of materials having good conductivity. The drain electrode 116a and the source electrode 116b may include any of conductive materials including Mo, Al, Cu, and Ti and may have a multi-layer or single layer structure including the materials described above. In an embodiment, the drain electrode 116a and the source electrode 116b may have a multi-layer structure of Ti/Al/Ti.

The planarization insulating layer 117 may include an organic insulating layer. The planarization insulating layer 117 may include any of a general-purpose polymer, such as poly(methyl methacrylate)(PMMA) or polystyrene (PS), a polymer derivative having a phenol-based group, acryl-based polymer, aryl ether-based polymer, amide-based polymer, fluorine-based polymer, p-xylene-based polymer, and a vinyl alcohol-based polymer, and an organic insulating material such as a blend thereof.

The display element layer DEL is located on the pixel circuit layer PCL having the above-described structure. The display element layer DEL may include an organic light-emitting diode OLED, and a pixel electrode 121 of the organic light-emitting diode OLED may be electrically connected to the thin-film transistor TFT via contact holes of the planarization insulating layer 117.

A pixel P may include the organic light-emitting diode OLED and the thin-film transistor TFT. Each pixel P may emit, for example, red, green, or blue light or red, green, blue, or white light via the organic light-emitting diode OLED.

In an embodiment, the pixel electrode 121 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 121 may include a reflective layer including silver (Ag), magnesium (Mg), Al, Pt, Pd, Au, Ni, Nd, Ir, Cr, or a compound thereof. In another embodiment, the pixel electrode 121 may further include a layer including ITO, IZO, ZnO, or $In_2O_3$ on/under the above-described reflective layer.

A pixel-defining layer 119 having an opening 119OP for exposing the center of the pixel electrode 121 is located on the pixel electrode 121. The pixel-defining layer 119 may include an organic insulating material and/or inorganic insulating material. The opening 119OP may be configured to define an emission area EA of light emitted from the organic light-emitting diode OLED. For example, a width of the opening 119OP may correspond to a width of the emission area EA.

An emission layer 122 may be located on the opening 119OP of the pixel-defining layer 119. The emission layer 122 may include a polymer or small molecular weight organic material that emits light with a certain color. The emission layer 122 described above may be formed using the apparatus 1 for manufacturing the display device.

Although not shown, in an embodiment, a first functional layer and a second functional layer may be located under and on the emission layer 122, respectively. The first functional layer may include a hole transport layer (HTL) or a hole injection layer (HIL). The second functional layer that is an element located on the emission layer 122 is optional. The second functional layer may include an electron transport layer (ETL) and/or electron injection layer (EIL). In an embodiment, the first functional layer and/or the second functional layer may be a common layer for covering the substrate 101 entirely, like in a common electrode 123 that will be described below.

The common electrode 123 may include a conductive material having a small work function. For example, the common electrode 123 may include a (semi-)transparent layer including Ag, Mg, Al, Pt, Pd, Au, Ni, Nd, Ir, Cr, lithium (Li), Ca, or an alloy thereof. In an embodiment, the common electrode 123 may further include ITO, IZO, ZnO, or $In_2O_3$ on the (semi-)transparent layer including the above-described materials.

In an embodiment, the thin-film encapsulation layer TFE may include at least one inorganic encapsulation layer and at least one organic encapsulation layer. In an embodiment, FIG. 11 illustrates that the thin-film encapsulation layer TFE includes a first inorganic encapsulation layer 131, an organic encapsulation layer 132, and a second inorganic encapsulation layer 133, which are sequentially stacked.

The first inorganic encapsulation layer 131 and the second inorganic encapsulation layer 133 may include one or more inorganic materials from among aluminum oxide, titanium oxide, tantalum oxide, hafnium oxide, zinc oxide, silicon oxide, silicon nitride, and silicon oxynitride. The organic encapsulation layer 132 may include any of polymer-based materials. The polymer-based materials may include any of an acryl-based resin, an epoxy-based resin, polyimide, and polyethylene. In an embodiment, the organic encapsulation layer 132 may include acrylate.

In another embodiment, the thin-film encapsulation layer TFE may have a structure in which the substrate 101 and an upper substrate that is a transparent member are coupled to each other via a sealing member and, thus, an internal space between the substrate 101 and the upper substrate is sealed. In this case, a moisture absorbent or filling material may be deposited in the internal space. The sealing member may be a sealant. In an embodiment, the sealing member may include a material cured by a laser. For example, the sealing member may be a frit. In an embodiment, the sealing member may include a urethane-based resin, an epoxy-based resin, or an acryl-based resin that is an organic sealant, or silicon that is an inorganic sealant. Urethane acrylate, for example, may be used as the urethane-based resin. Butylacrylate or ethylhexylacrylate, for example, may be used as the acryl-based resin. In an embodiment, the sealing member may include a material cured by heat.

In an embodiment, a touch electrode layer (not shown) including touch electrodes may be located on the thin-film encapsulation layer TFE, and an optical functional layer (not shown) may be located on the touch electrode layer. The touch electrode layer may attain coordinate information due to an external input, for example, a touch event. The optical functional layer may reduce reflectivity of light (external light) incident onto the display device 100 from the outside and/or may increase color purity of light emitted from the display device 100. In an embodiment, the optical functional layer may include a retarder and a polarizer. The retarder may be of a film type or liquid crystal coating type and may include a λ/2 retarder and/or a λ/4 retarder. The polarizer may also be of a film type or liquid crystal coating type. The film type may include an elongation type synthetic resin film, and the liquid crystal coating type may include liquid crystals arranged in a certain arrangement (e.g., a predetermined arrangement). In an embodiment, the retarder and the polarizer may further include a protective film.

In another embodiment, the optical functional layer may include a black matrix and color filters. The color filters may be arranged in consideration of color of light emitted from each of pixels of the display device 100. Each of the color filters may include a red, green, or blue pigment or dye. In an embodiment, each of the color filters may further include a quantum dot in addition to the pigment or dye described above. In another embodiment, part of the color filters may not include the pigment or dye described above and may include scattered particles such as titanium oxide.

In another embodiment, the optical functional layer may include a destructive interference structure. The offset interference structure may include a first reflective layer and a second reflective layer that are located on different layers. First reflected light and second reflected light reflected from the first reflective layer and the second reflective layer, respectively, may be destructive-interfered. Thus, reflectivity of the external light may be reduced.

In an embodiment, an adhesive member may be located between the touch electrode layer and the optical functional layer. A well-known general adhesive member in the art may be used as the adhesive member without limitations. In an embodiment, the adhesive member may be a pressure sensitive adhesive (PSA).

As described above, in one or more embodiments, at least parts of dummy openings include centers arranged to deviate from an imaginary straight line connecting centers of deposition openings such that a mask assembly that is robust to breakage, an apparatus for manufacturing a display device, and a method of manufacturing the display device may be provided.

It is to be understood that embodiments described herein should be considered in a descriptive sense and not for purposes of limitation. Descriptions of features or aspects within each embodiment should typically be considered as available for other similar features or aspects in other embodiments. While some embodiments have been described with reference to the figures, it will be understood by those of ordinary skill in the art that various changes in form and details may be made therein without departing from the spirit and scope as set forth by the following claims.

What is claimed is:

1. A mask assembly comprising:
   a mask frame comprising an opening and a portion surrounding the opening; and
   a mask arranged and tensioned in a first direction on the mask frame and comprising a first region and a second region, wherein a deposition material is passable through the first region corresponding to the opening, and the second region is around the first region,
   wherein the first region comprises deposition openings, and
   the second region comprises dummy openings, wherein at least some of the dummy openings comprise centers arranged to deviate from a straight line extending in the first direction and connecting centers of the deposition openings, and
   a width of each of the deposition openings is the same as a width of each of the dummy openings.

2. The mask assembly of claim 1, wherein a planar shape of each of the deposition openings and a planar shape of each of the dummy openings are the same.

3. The mask assembly of claim 1, wherein the dummy openings comprise first openings and second openings, and
   the first openings comprise centers arranged to deviate from the straight line connecting the centers of the deposition openings.

4. The mask assembly of claim 3, wherein the second openings comprise centers arranged to deviate from a straight line connecting the centers of the first openings, and
   the first openings and the second openings are alternately arranged in the first direction from the deposition openings to the dummy openings.

5. The mask assembly of claim 3, wherein the second openings are arranged along the same straight line as the deposition openings.

6. The mask assembly of claim 5, wherein distances at which the second openings are arranged along the same straight line as the deposition openings are constant.

7. The mask assembly of claim 1, wherein a first distance between adjacent deposition openings from among the deposition openings is the same as a second distance between adjacent dummy openings from among the dummy openings.

8. The mask assembly of claim 1, wherein a width of the mask is less than a width of the opening, and
   the mask assembly comprises a plurality of masks comprising the mask arranged on the mask frame.

9. The mask assembly of claim 1, wherein the second region is between the first region and the mask frame.

10. The mask assembly of claim 1, wherein the second region surrounds at least part of the first region.

11. The mask assembly of claim 1, wherein at least some of the dummy openings are arranged in the same straight line as the deposition openings.

12. A mask assembly comprising:
    a mask frame comprising an opening and a portion surrounding the opening; and
    a mask arranged and tensioned in a first direction on the mask frame and comprising a first region and a second region, wherein a deposition material is passable through the first region, and the second region is around the first region,
    wherein the first region comprises a plurality of first portions configured to shield the deposition material and extending in the first direction, and
    a first portion from among the plurality of first portions is connected to a second portion from among a plurality of second portions extending in a second direction crossing the first direction in the second region, and
    a width of the first portion from among the plurality of first portions is the same as a width of the second portion from among the plurality of second portions.

13. The mask assembly of claim 12, wherein the first portion from among the plurality of first portions is connected to a third portion from among a plurality of third portions extending in a third direction crossing the first direction.

14. An apparatus for manufacturing a display device, the apparatus comprising:
a chamber in which a substrate is positionable;
a deposition source located inside the chamber and configured to supply a deposition material into the chamber; and
a mask assembly facing the deposition source and configured to pass the deposition material therethrough towards the substrate,
wherein the mask assembly comprises:
a mask frame comprising an opening and a portion surrounding the opening; and
a mask arranged and tensioned in a first direction on the mask frame and comprising a first region and a second region, wherein the deposition material is passable through the first region corresponding to the opening, and the second region is around the first region,
wherein the first region comprises deposition openings, and
the second region comprises dummy openings, wherein at least some of the dummy openings comprise centers arranged to deviate from a straight line extending in the first direction and connecting centers of the deposition openings, and
a width of each of the deposition openings is the same as a width of each of the dummy openings.

15. The apparatus of claim 14, wherein a planar shape of each of the deposition openings and a planar shape of each of the dummy openings are the same.

16. The apparatus of claim 14, wherein the dummy openings comprise first openings and second openings, and
the first openings comprise centers arranged to deviate from the straight line connecting the centers of the deposition openings.

17. The apparatus of claim 16, wherein the second openings comprise centers arranged to deviate from a straight line connecting the centers of the first openings, and
the first openings and the second openings are alternately arranged in the first direction from the deposition openings to the dummy openings.

18. The apparatus of claim 16, wherein the second openings are arranged along the same straight line as the deposition openings.

19. The apparatus of claim 18, wherein distances between the second openings arranged along the same straight line as the deposition openings are constant.

20. The apparatus of claim 14, wherein a first distance between adjacent deposition openings from among the deposition openings is the same as a second distance between adjacent dummy openings from among the dummy openings.

21. The apparatus of claim 14, wherein at least some of the dummy openings are arranged along the same straight line as the deposition openings.

22. A method of manufacturing a display device, the method comprising:
positioning a substrate within a chamber;
supplying a deposition material into the chamber by using a deposition source located inside the chamber; and
forming an organic layer on the substrate by using the deposition material that passes through a mask assembly facing the deposition source,
wherein the mask assembly comprises:
a mask frame comprising an opening and a portion surrounding the opening; and
a mask arranged and tensioned in a first direction on the mask frame and comprising a first region and a second region, wherein the deposition material passes through the first region corresponding to the openings, and the second region is around the first region, and
the first region comprises deposition openings, and
the second region comprises dummy openings, wherein at least some of the dummy openings comprise centers arranged to deviate from a straight line extending in the first direction and connecting centers of the deposition openings, and
a width of each of the deposition openings is the same as a width of each of the dummy openings.

23. The method of claim 22, wherein a planar shape of each of the deposition openings and a planar shape of each of the dummy openings are the same.

24. The method of claim 22, wherein the dummy openings comprise first openings and second openings, and
the first openings comprise centers arranged to deviate from the straight line connecting the centers of the deposition openings.

25. The method of claim 24, wherein the second openings comprise centers arranged to deviate from a straight line connecting the centers of the first openings, and
the first openings and the second openings are alternately arranged in the first direction from the deposition openings to the dummy openings.

26. The method of claim 24, wherein the second openings are arranged along the same straight line as the deposition openings.

27. The method of claim 26, wherein distances at which the second openings are arranged along the same straight line as the deposition openings are constant.

28. The method of claim 22, wherein a first distance between adjacent deposition openings from among the deposition openings is the same as a second distance between adjacent dummy openings from among the dummy openings.

29. The method of claim 22, wherein a width of the mask is less than a width of the opening, and
the mask assembly comprises a plurality of masks comprising the mask arranged on the mask frame.

30. The method of claim 22, wherein the second region is between the first region and the mask frame.

31. The method of claim 22, wherein the second region surrounds at least part of the first region.

32. The method of claim 22, wherein at least some of the dummy openings are arranged along the same straight line as the deposition openings.

* * * * *